US008652254B2

(12) United States Patent
Soeta et al.

(10) Patent No.: US 8,652,254 B2
(45) Date of Patent: Feb. 18, 2014

(54) METHOD FOR PULLING SILICON SINGLE CRYSTAL

(75) Inventors: Satoshi Soeta, Echizen (JP); Masahiro Mori, Echizen (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 1085 days.

(21) Appl. No.: 12/450,961

(22) PCT Filed: Apr. 14, 2008

(86) PCT No.: PCT/JP2008/000976
§ 371 (c)(1),
(2), (4) Date: Oct. 20, 2009

(87) PCT Pub. No.: WO2008/146439
PCT Pub. Date: Dec. 4, 2008

(65) Prior Publication Data
US 2010/0089309 A1 Apr. 15, 2010

(30) Foreign Application Priority Data
May 23, 2007 (JP) .................................. 2007-137073

(51) Int. Cl.
*C30B 15/22* (2006.01)
(52) U.S. Cl.
USPC .................... 117/16; 117/13; 117/15; 117/35
(58) Field of Classification Search
USPC ......................... 117/13, 15, 16, 35
See application file for complete search history.

(56) References Cited

U.S. PATENT DOCUMENTS

| 5,578,284 A | 11/1996 | Chandrasekhar et al. | |
|---|---|---|---|
| 2003/0097975 A1* | 5/2003 | Nettleton et al. | 117/13 |
| 2005/0229840 A1* | 10/2005 | Iida et al. | 117/13 |
| 2006/0065184 A1* | 3/2006 | Sakurada et al. | 117/19 |
| 2006/0191468 A1* | 8/2006 | Hoshi et al. | 117/19 |
| 2007/0056504 A1* | 3/2007 | Lim | 117/13 |

FOREIGN PATENT DOCUMENTS

| JP | A-9-2898 | 1/1997 |
|---|---|---|
| JP | A-2001-199788 | 7/2001 |
| JP | A-2004-165489 | 6/2004 |
| JP | A-2004-315258 | 11/2004 |

OTHER PUBLICATIONS

Taishi et al., "Heavily Boron-Doped Silicon Single Crystal Growth: Boron Segregation," Japanese Journal of Applied Physics, Mar. 1999, pp. L223-L225, vol. 38, No. 3A, Publication Board.

* cited by examiner

*Primary Examiner* — Bob M Kunemund
(74) *Attorney, Agent, or Firm* — Oliff PLC

(57) ABSTRACT

The invention is a method for pulling a silicon single crystal, which is a Czochralski method for growing the silicon single crystal by contacting a seed crystal with a melt and by pulling up, including the steps of: contacting the seed crystal with the melt; forming a necking portion under the seed crystal; and forming the silicon single crystal under the necking portion by increasing a diameter, wherein a pulling rate during forming the necking portion is 2 mm/min or less, and the silicon single crystal with the increased diameter is a boron-doped silicon single crystal having a resistivity of 1.5 mΩ·cm or less at a shoulder portion. Therefore, there can be provided a method of pulling a silicon single crystal without generating defects such as scratches at a wafer surface in the case of processing a boron-doped silicon single crystal ingot with a low resistivity produced by CZ method into a wafer.

2 Claims, 1 Drawing Sheet

METHOD FOR PULLING SILICON SINGLE CRYSTAL

TECHNICAL FIELD

The present invention relates to a method for pulling a silicon single crystal.

BACKGROUND ART

An epitaxial wafer has been widely used from long ago as a wafer for fabricating a discrete semiconductor, a bipolar IC and the like, because of its excellent characteristics. Especially, a low-resistivity wafer for epitaxial growth, whose resistivity is lowered, which is applied to a substrate of an epitaxial wafer, has grown in importance, because of excellent latchup characteristic and gettering ability. For these reasons, a tendency for lowering resistivity of an Epi-Sub (Epitaxial-Substrate) single crystal as the wafer for epitaxial growth has been progressed in recent years.

A silicon wafer used for a semiconductor device is generally produced from a silicon single crystal grown by mainly the Czochralski method (hereafter, referred to as "CZ method"). CZ method is a method by which a seed crystal is contacted with a silicon melt contained in a quartz crucible, the seed crystal is pulled up, and thereby the silicon single crystal is grown under the seed crystal. In the growth of the silicon single crystal by CZ method as described above, dislocations are generated in the seed crystal in high density as a result of thermal shock at the time that the seed crystal contacts with the silicon melt. For this reason, in order to eliminate generated dislocations, the steps of: a neck (a necking portion) is formed; the diameter of the crystal is increased to a desired diameter; and thereby the silicon single crystal is formed, are necessary when the seed crystal is pulled up. The above-mentioned method of forming the necking portion by decreasing a diameter of the seed crystal is widely used as the Dash Necking method and is sometimes called as a necking step.

In the step of decreasing the diameter of the seed crystal by the Dash Necking method described above, the diameter of the necking portion of the seed crystal is conventionally 4 mm or less, and a growth rate is controlled so that the diameter may become such a predetermined value and conventionally varied from 1 to 10 mm/min.

However, when the above-mentioned Epi-Sub single crystal having low resistivity (e.g., 0.1 Ω·cm or less) is grown, since a concentration of dopant impurities such as metal boron for doping is high, a frequency of generating dislocations during growth is higher than that of a silicon single crystal having ordinary-resistivity, therefore there has been a problem of difficulty in single-crystallization (e.g., Japanese Patent Application Laid-open (kokai) No. 2004-315258).

Further, in the case of an Epi-Sub single crystal having an extremely low resistivity of 1.5/1000 Ω·cm, since dopant impurities with high concentration in the crystal inhibit migration of dislocations, it is difficult to eliminate dislocations completely even if the above-mentioned necking step in the process of growth of the silicon single crystal by CZ method is performed. Moreover, as for a crystal which is judged that the single crystal can be formed by CZ method by observation of the crystal surface, there is a problem that defects such as scratches are generated at a wafer surface (FIG. 1) when such a low-resistivity single crystal ingot is processed into a wafer.

As for the above-mentioned low-resistivity single crystal ingot from which the wafer is produced, although defects are not observed at the surface, defects such as scratches are detected in some cases at an end face of the ingot by observation using X-ray topograph after the ingot is cut and the end face thereof is etched (FIG. 2). Moreover, even if an ingot in which scratches are not observed by X-ray topograph is processed into a wafer, defects as shown in FIG. 1 are detected in some cases at the wafer. That is, as for the above-mentioned Epi-Sub single crystal having low resistivity, it has been very difficult to detect defects such as scratches at the state of ingot, and the judge method thereof has not been established yet. Therefore, since it is impossible to confirm whether defects such as scratches present or not until processing into the wafer, there have been problems that a cost for wafer processing is high and the productivity is decreased.

DISCLOSURE OF THE INVENTION

The present invention is made in view of the above problems and an object of the present invention is to provide a method for pulling a silicon single crystal without generating defects such as scratches at a wafer surface in the case of processing a boron-doped silicon single crystal ingot with a low resistivity produced by CZ method into a wafer.

The present invention for achieving the above-mentioned object is a method for pulling a silicon single crystal, which is a Czochralski method for growing the silicon single crystal by contacting a seed crystal with a melt and by pulling up, including the steps of: contacting the seed crystal with the melt; forming a necking portion under the seed crystal; and forming the silicon single crystal under the necking portion by increasing a diameter, wherein a pulling rate during forming the necking portion is 2 mm/min or less, and the silicon single crystal with the increased diameter is a boron-doped silicon single crystal having a resistivity of 1.5 mΩ·cm or less at a shoulder portion.

As described above, in the case of growing the boron-doped silicon single crystal having the extremely low resistivity of 1.5 mΩ·cm or less at a shoulder portion, by setting the pulling rate during forming the necking portion to 2 mm/min or less in the steps of: contacting the seed crystal with the melt; followed by forming the necking portion under the seed crystal; and subsequently forming the silicon single crystal under the necking portion by increasing the diameter, the low-resistivity boron-doped silicon single crystal which is free from dislocations can be obtained.

In this case, it is preferable that a diameter of the necking portion is 2 mm or more and less than 5 mm.

In this way, by decreasing the diameter of the necking portion to 2 mm or more and less than 5 mm and reducing the pulling rate during forming the necking portion, dislocations are eliminated at the surface more easily, enough time for complete elimination of dislocations can be kept, and thereby the silicon single crystal which is free from dislocations can be obtained. As described above, such a measure for dislocation-free is necessary especially for a boron-doped silicon single crystal with low resistivity in which dislocations are hardly eliminated, thereby the present invention is effective.

The method for pulling a silicon single crystal according to the present invention can surely suppress defects such as scratches generated at the surface of the wafer, in the case of processing the low-resistivity boron-doped silicon single crystal ingot produced by CZ method into a wafer. As a result, it becomes possible to reduce the processing cost for forming the low-resistivity wafer for epitaxial growth.

BEST MODES FOR CARRYING OUT THE INVENTION

Figure 1:
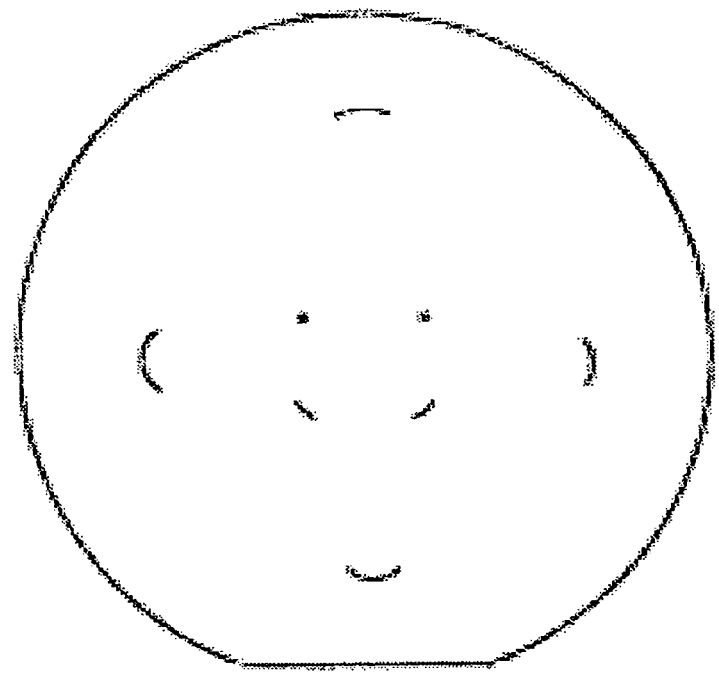
FIG. 1 is a sketch of scratch defects observed in a wafer obtained by processing a low-resistivity single crystal ingot grown according to a conventional method.
Figure 2:
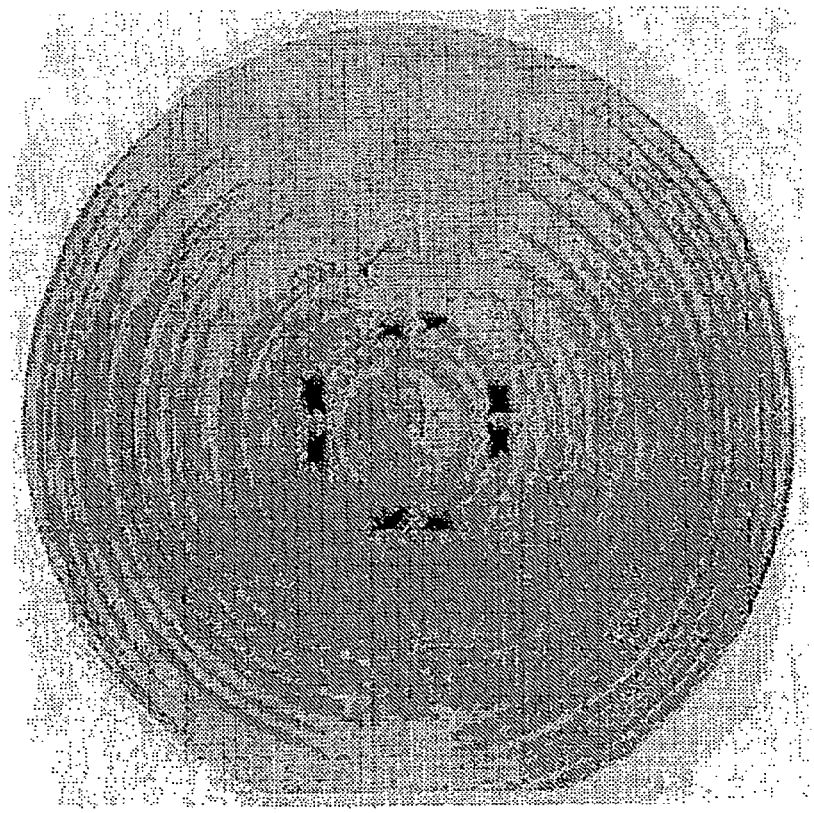
FIG. 2 is an X-ray topographic image of an etched end face of a low-resistivity single crystal ingot grown according to a conventional method.

As described above, since a low-resistivity Epi-Sub single crystal includes many dopant impurities such as metal boron, these dopant impurities with high concentration inhibit migration of dislocations; thereby there has been a problem that dislocations can not be eliminated completely even if the above-mentioned necking process is performed. In addition, there have been problems that such a low-resistivity single crystal cannot be judged by a surface whether defects present or not, defects such as scratches are sometimes generated on a wafer obtained from the single crystal, etc.

To these problems, the present inventors have considered that the fact that defects are generated in the wafer is attributed not to a process of wafer processing, but to a method for pulling the single crystal in a process of growing the single crystal. Then, the present inventors have keenly performed experiments and studies. As a result of studies, the present inventors have discovered that in the case of growing a boron-doped silicon single crystal having an extremely low resistivity of 1.5 mΩ·cm or less at a shoulder portion, by setting a pulling rate during forming a necking portion to 2 mm/min or less in the steps of: contacting a seed crystal with the melt; followed by forming a necking portion under the seed crystal; and subsequently forming a silicon single crystal under the necking portion by increasing a diameter, the low-resistivity boron-doped silicon single crystal which is free from dislocations can be obtained even if being processed into a wafer.

An embodiment of the present invention will now be explained hereinafter, but the present invention is not restricted thereto.

For example, a seed crystal for growth of a single crystal about 10 mm×10 mm is set to an end portion of a pulling shaft or wire, the seed crystal is contacted with a surface of a silicon melt in a crucible having a diameter of 450 mm, and then a necking portion having a diameter of 2 mm or more and less than 5 mm is formed. First, a diameter is decreased from a diameter of the seed crystal and the diameter is decreased in a decreased-diameter portion to a desired diameter at a predetermined rate. From the time reaching a constant-diameter portion in the range of 2 to 5 mm, the necking portion is formed at a pulling rate of 2 mm/min or less. Subsequently, the diameter is increased to 205 mm, and a silicon single crystal is grown. At this time, the silicon single crystal increased diameter is doped in order to have a resistivity of 1.5 mΩ·cm or less at a shoulder portion by previously adding metal boron into the silicon melt.

As described above, by reducing the pulling rate during forming the necking portion, it is possible to keep enough time for elimination of dislocations at the surface layer. Therefore, in the case of the low-resistivity boron-doped silicon single crystal, which conventionally has a problem that migration of dislocations are inhibited by dopant impurities, it is possible to keep enough time for complete elimination of dislocations, and thereby it is possible to accomplish dislocation-free effectively. Further, the slower the pulling rate during forming the necking portion is, the better.

It is possible to obtain a low-resistivity wafer for epitaxial growth with no defects such as scratches by slicing the low-resistivity boron-doped silicon single crystal obtained according to the above-mentioned method into a wafer.

In this case, as for the boron-doped silicon single crystal, the reason that defects such as scratches are suppressed by reducing the pulling rate of the necking portion is unclear, but it is considered as below.

When dislocations are eliminated at the necking surface, dislocations sometimes move upwards in the case of edge dislocations. Moving upwards of dislocations, which is different from ordinary slip of dislocations, can be generated only after vacancies reach the dislocations. In other words, a diffusion of vacancies determines a rate. By reducing the pulling rate, a high-temperature area where the diffusion is active can be retained for a long time. Thereby, the moving upwards of dislocations is promoted, and dislocations-free is achieved even in the case of a low-resistivity crystal.

Hereinbelow, the present invention will be explained specifically by Examples of the present invention, but the present invention is not restricted by them.

Comparative Example 1

A seed crystal for growth of a single crystal about 10 mm square was set to an end portion of a pulling wire, the seed crystal was contacted with a surface of a silicon melt in a crucible, and then a necking portion having a diameter of 5 mm was formed. First, the diameter was decreased in the decreased-diameter portion to a desired diameter of 5 mm at a predetermined rate. From the time reaching a constant diameter portion of 5 mm, the necking portion was formed at a pulling rate of 10 mm/min or less (maximum: 10 mm/min and average: 6.5 mm/min). Subsequently, the diameter was increased, and a silicon single crystal having the diameter of 205 mm was grown. Further, when the material melt was previously doped with metal boron element, a resistivity at a shoulder portion of the silicon single crystal with the increased diameter was varied as shown in Table 1, thereby each boron-doped silicon single crystal was produced.

The incidence of scratch defects, at the time when the boron-doped silicon single crystal with each resistivity which is obtained by above-mentioned method and observed dislocation-free by appearance of the ingot was processed into a wafer, was shown in Table 1. As shown in Table 1, it revealed that almost no scratch defects are observed in the case of the wafer produced by using the boron-doped silicon single crystal with the resistivity of 2 mΩ·cm or more. On the other hand, the incidence of scratch defects of the wafer produced by using the boron-doped silicon single crystal with the resistivity of 1.5 mΩ·cm or less was extremely high. From these facts, scratch defects become marked only in the case of the low resistivity.

TABLE 1

| Target resistivity at the shoulder portion | Incidence of scratch defects |
| --- | --- |
| 10 mΩ · cm | 0% |
| 2 mΩ · cm | 3% |
| 1.5 mΩ · cm | 25% |
| 1 mΩ · cm | 70% |

Example, Comparative Example

A seed crystal for growth of a single crystal about 10 mm square was set to an end portion of a pulling wire, the seed crystal was contacted with a surface of a silicon melt in a crucible, and then a necking portion having a diameter of 5 mm was formed. Subsequently, the diameter was increased to 205 mm, and a silicon single crystal was grown. Formation of the necking portion was carried out by varying a pulling rate as shown in Table 2. Further, at this time, the material melt was previously doped with metal boron element so that a resistivity of the silicon single crystal with the increased diameter was 1 mΩ·cm at a shoulder portion.

The incidence of scratch defects, at the time when the boron-doped silicon single crystal with the resistivity of 1 mΩ·cm grown at each pulling rate was processed into a wafer, was shown in Table 2. As shown in Table 2, the incidence of scratch defects at a wafer produced by using the boron-doped silicon single crystal pulled at 3 mm/min or more during forming a necking portion, in spite of dislocations-free by appearance of the ingot, was extremely high. On the other hand, in the case of the boron-doped silicon single crystal in which the necking portion was formed at the pulling rate of 2 mm/min or less as the example, scratch defects was not generated at all even if the single crystal was processed into a wafer. From this, it was found that, in the case of growing the boron-doped silicon single crystal with the resistivity of 1 mΩ·cm, by reducing the pulling rate during forming the necking portion, dislocations were eliminated, and scratch defects were not generated even if the single crystal was processed into a wafer.

TABLE 2

| Pulling rate during forming the necking portion | Incidence of scratch defects |
| --- | --- |
| Conventional method (≤10 mm/min) | 70% |
| ≤5 mm/min | 70% |
| ≤3 mm/min | 50% |
| ≤2 mm/min | 0% |

From the above result, it was revealed that in the case of growing the boron-doped silicon single crystal with an extremely low resistivity of 1.5 mΩ·cm or less at a shoulder portion, by setting a pulling rate during forming a necking portion to 2 mm/min or less in the steps of: contacting the seed crystal with the melt; followed by forming a necking portion under the seed crystal; and subsequently forming the silicon single crystal under the necking portion by increasing a diameter, the boron-doped silicon single crystal with a low resistivity which is free from dislocations could be obtained. Therefore, it was revealed that, by producing a wafer using such a single crystal, the wafer for epitaxial growth with low resistivity, which is free from defects such as scratch defects, could be obtained.

It is to be noted that the present invention is not restricted to the foregoing embodiment. The foregoing embodiment is just an example, and any examples that have substantially the same features and demonstrate the same functions and effects as those in the technical concept described in claims of the present invention are included in the technical scope of the present invention.

The invention claimed is:

1. A method for pulling a silicon single crystal, which is a Czochralski method for growing the silicon single crystal by contacting a seed crystal with a melt and by pulling up, comprising the steps of: contacting the seed crystal with the melt;

forming a necking portion under the seed crystal; and forming the silicon single crystal under the necking portion by increasing a diameter, wherein a pulling rate during forming the necking portion is 2 mm/min or less, and the silicon single crystal with the increased diameter is a boron-doped silicon single crystal having a resistivity of 1.5 mΩ·cm or less at a shoulder portion, so that the silicon single crystal is grown without generating scratch defects at a wafer surface, in the case of processing the silicon single crystal into a wafer.

2. The method for pulling a silicon single crystal according to claim 1, wherein a diameter of the necking portion is 2 mm or more and less than 5 mm.

* * * * *